United States Patent [19]

Seki et al.

[11] Patent Number: 5,097,262
[45] Date of Patent: Mar. 17, 1992

[54] ANALOG-TO-DIGITAL CONVERTER FOR CAMERA

[75] Inventors: Youichi Seki; Hiroyuki Saito; Michio Kawai; Michio Taniwaki, all of Yotsukaido, Japan

[73] Assignee: Seikosha Co., Ltd., Japan

[21] Appl. No.: 72,965

[22] Filed: Jul. 14, 1987

[30] Foreign Application Priority Data

Jul. 15, 1986 [JP] Japan .................. 63-165753

[51] Int. Cl.[5] .............................. H03K 13/02
[52] U.S. Cl. ..................... 341/126; 354/426
[58] Field of Search ............... 340/347 AD, 347 NT; 354/426

[56] References Cited

U.S. PATENT DOCUMENTS 3,537,003 10/1970 Planta et al. .
3,875,503 4/1975 Hayashi .................. 340/347 NT
3,939,459 2/1976 Hoopes .................. 340/347 NT
4,057,809 11/1977 Nakamoto .................. 354/426
4,128,885 12/1978 Valek .................. 340/347 NT
4,445,111 4/1984 Swift .................. 340/347 NT Primary Examiner—Bernard Roskoski
Attorney, Agent, or Firm—Bruce L. Adams; Van C. Wilks

[57] ABSTRACT

An analog-to-digital converter for a camera has a reference signal generating element, a measurement signal generating element, and pulse output means for generating pulses of pule durations corresponding respectively to signals from the generating elements. The generating elements are alternately selected to produce two pulse durations, and the ratio of these two durations is computed by pulse duration ratio computing means. Control information corresponding to the computed ratio is retrieved from memory means.

5 Claims, 4 Drawing Sheets

ANALOG-TO-DIGITAL CONVERTER FOR CAMERA

BACKGROUND OF THE INVENTION

1. Technical field

The present invention relates to an analog-to-digital converter suitable for electronic control of a camera.

2. Prior Art

As cameras are automated in operation, the brightness and range information of objects to be photographed are required to be converted to digital signals. For example, as shown in Japanese Laid-Open Patent Publication No. 60-164728, there has been proposed a digital photometric device in which an object brightness detector Rt and a capacitor C are coupled in series with each other, and clock pulses are counted from the time when a photometric process is started until the voltage across the capacitor C reaches a reference voltage.

However, the proposed device is disadvantageous in that the measuring accuracy is lowered by variations in the electrostatic capacity of the capacitor C and variations in the reference voltage. Another problem is that since a comparator, used for comparing the capacitor voltage, with the reference voltage has three transistors T1, T2, T3 connected in series with a power supply Ve as shown in FIG. 6, the power supply required has to produce a high voltage which is three time the threshold voltage of each of the transistors.

SUMMARY OF THE INVENTION

The present invention has been made in view of the above problems. It is an object of the present invention to provide a novel analog-to-digital converter for a camera, which has high conversion accuracy and can be driven by a low voltage.

DETAILED DESCRIPTION OF THE PREFERRED EMBODIMENTS

Figure 1:
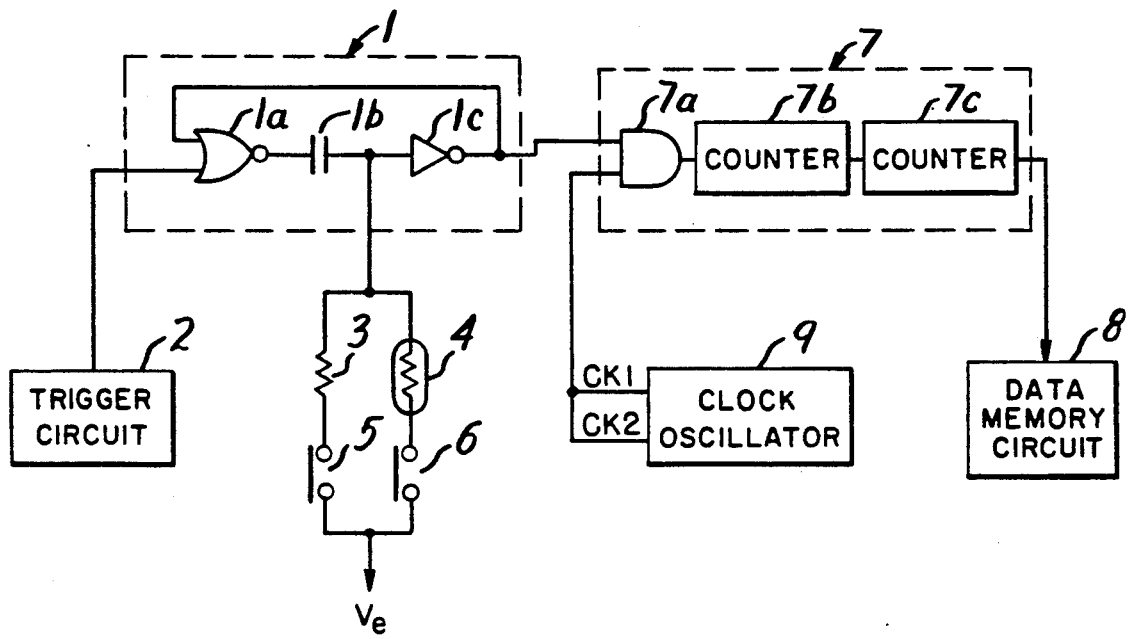
FIG. 1 is a block diagram of a device according to an embodiment of the present invention.

FIG. 1 shows an embodiment of the present invention. Designated by the reference numeral 1 is a one-shot multivibrator having a NOR gate 1a, a capacitor 1b, and an inverter 1c connected in series. One input terminal of the NOR gate 1a is connected to the output terminal of the inverter 1c, and the other input terminal of the NOR gate 1a is coupled to a trigger circuit 2. A voltage Ve is applied selectively through switches 5, 6 interlinked to a release button, a reference resistor 3, and a light detector 4 having a photoresistive conversion capability. A pulse duration ratio computing circuit 7 comprises an AND gate 7a having one input terminal supplied with a pulse signal from the one-shot multivibrator 1 and the other input terminal supplied selectively with a clock signal CK1 of a lower repetition frequency and a clock signal CK2 of a higher repetition frequency, a presettable counter 7b supplied with the clock signal from the AND gate 7a, and a counter 7c for counting a count-up signal from the counter 7b. The pulse duration ratio computing circuit 7 serves to compute the ratio between the numbers of two clock signals. Denoted at 8 is a data memory circuit 8 for storing exposure values corresponding to and addressable by the outputs from the pulse duration ratio computing circuit 7 as shown in Table 1.

TABLE 1

| Zone | Tx/Ts | Object brightness |
|---|---|---|
| 0 | –0.55 | –15¾ |
| 1 | 0.55–0.66 | 15¾–15¼ |
| 2 | 0.66–0.78 | 15¼–14¾ |
| 3 | 0.78–0.91 | 14¾–14¼ |
| 4 | 0.91–1.08 | 14¼–13¾ |
| 5 | 1.08–1.28 | 13¾–13¼ |
| 6 | 1.28–1.58 | 13¼–12¾ |
| 7 | 1.58–1.89 | 12¾–12¼ |
| 8 | 1.89–2.29 | 12¼–11¾ |
| 9 | 2.29–2.80 | 11¾–11¼ |
| 10 | 2.80–3.43 | 11¼–10¾ |
| 11 | 3.43–4.22 | 10¾–10¼ |
| 12 | 4.22–5.14 | 10¼–9¾ |
| 13 | 5.14–6.29 | 9¾–9¼ |
| 14 | 6.29–7.54 | 9¼–8¾ |
| 15 | 7.54– | 8¾–8¼ |

Designated at 9 is a clock oscillator.

Figure 2:
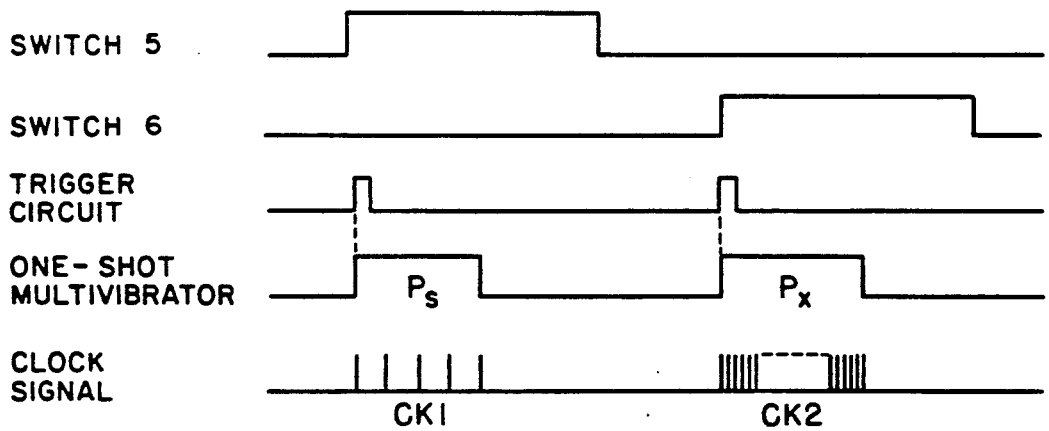
FIG. 2 is a timing chart showing the operation of the device of FIG. 1.

Operation of the device thus constructed will hereinafter be described with reference to the timing diagram of FIG. 2.

When the release button is depressed to a first step in order to measure the brightness of an object to be photographed, the switch 5 is turned on to allow the voltage Ve to be applied through the reference resistor 3 to the one-shot multivibrator 1, and a trigger signal is applied from the trigger circuit 2.

The multivibrator 1 then issues a pulse Ps having a duration determined by a time constant of the capacitor 1b and the reference resistor 3. The pulse Ps is applied to the pulse duration ratio computing circuit 7 to open the gate 7a, thus allowing the clock pulses CK1 to be applied to the presettable counter 7b which counts and presets the number of clock pulses equal to the pulse duration. The pulse duration Ts of the pulse Ps is expressed by:

$$Rs \cdot C \cdot \ln \frac{Ve - Vth}{Ve}.$$

where Rs is the resistance of the reference resistor 3, C the capacitance of the capacitor, Ve the power supply voltage, and Vth the threshold voltage of the inverter. The pulse duration Ts is thus of a value proportional to the reference resistor 3.

At the time the issuance of the pulse Ps based on the reference resistor 3 is completed, the switch 5 is turned off and the switch 6 is turned on to permit the voltage Ve to be applied through the light detector 4 to the multivibrator 1, and a trigger pulse is applied. The multivibrator 1 then produces a pulse Px having a time duration Tx, expressed below, proportional to the resistance Rx of the light detector 4 which is commensurate with the object brightness.

$$Rx \cdot C \cdot \ln \frac{Ve - Vth}{Ve}$$

The pulse Px is applied to the pulse duration ratio computing circuit 7 to open the gate 7a which allows the clock pulses CK2 to be impressed on the presettable counter 7b. The presettable counter 7b starts counting the clock pulses CK2, and issues a count-up signal each time the count reaches a preset value which has set been based on the pulse Ps, so that the counter 7c counts the count-ups.

The count or count number in the counter 7c is indicative of the ratio of the pulse durations of the pulse signals Ps, Px, i.e., $$\frac{Tx}{Ts} = \frac{Rx \cdot C \cdot \ln \frac{Ve - Vth}{Ve}}{Rs \cdot C \cdot \ln \frac{Ve - Vth}{Ve}} = \frac{Rx}{Rs}$$

Therefore, the count is only related to the resistances of the reference resistor 3 and the light detector 4 while the capacitance C of the capacitor 1b, the power supply voltage Ve, and the threshold voltage Vth are cancelled out. Accordingly, the count is of highly accurate and free from the influences due to variations in the power supply voltage Ve, the threshold voltage Vth which varies with the power supply voltage, and the capacitance of the capacitor which varies with time and temperature.

However, photometric errors due to variations in the linearity (so-called $\gamma$ characteristics) of the Cds resistance with respect to variations in the quantity of incident light cannot be removed.

The resistance of Cds has been described as Rx. Rx and the brightness are related to each other according to the following equation:

$$Rx = Ro \times 2^{\gamma(n-x)}$$

where Ro is the resistance at reference brightness, n the reference brightness, and x the object brightness. Therefore, when $\gamma$ varies, so does Rx. Since $\gamma$ is the exponent of 2, it greatly affects Rx.

It is possible to measure the Cds resistance to give and divide the same in order to make its variations small. It is also possible to make so many divisions that the variation in each division is substantially zero.

Therefore, proper brightness can be obtained by storing values corresponding to pulse duration ratios inherent in $\gamma$ in the respective divisions. The value of a desired division can be determined by selecting the corresponding one of as many terminals as the number of the divisions. The values according to the divisions are stored in the data memory circuit.

The computed value is applied to the data memory circuit 8 to access a corresponding address for obtaining object brightness information which is employed as a parameter for exposure control.

Figure 3:
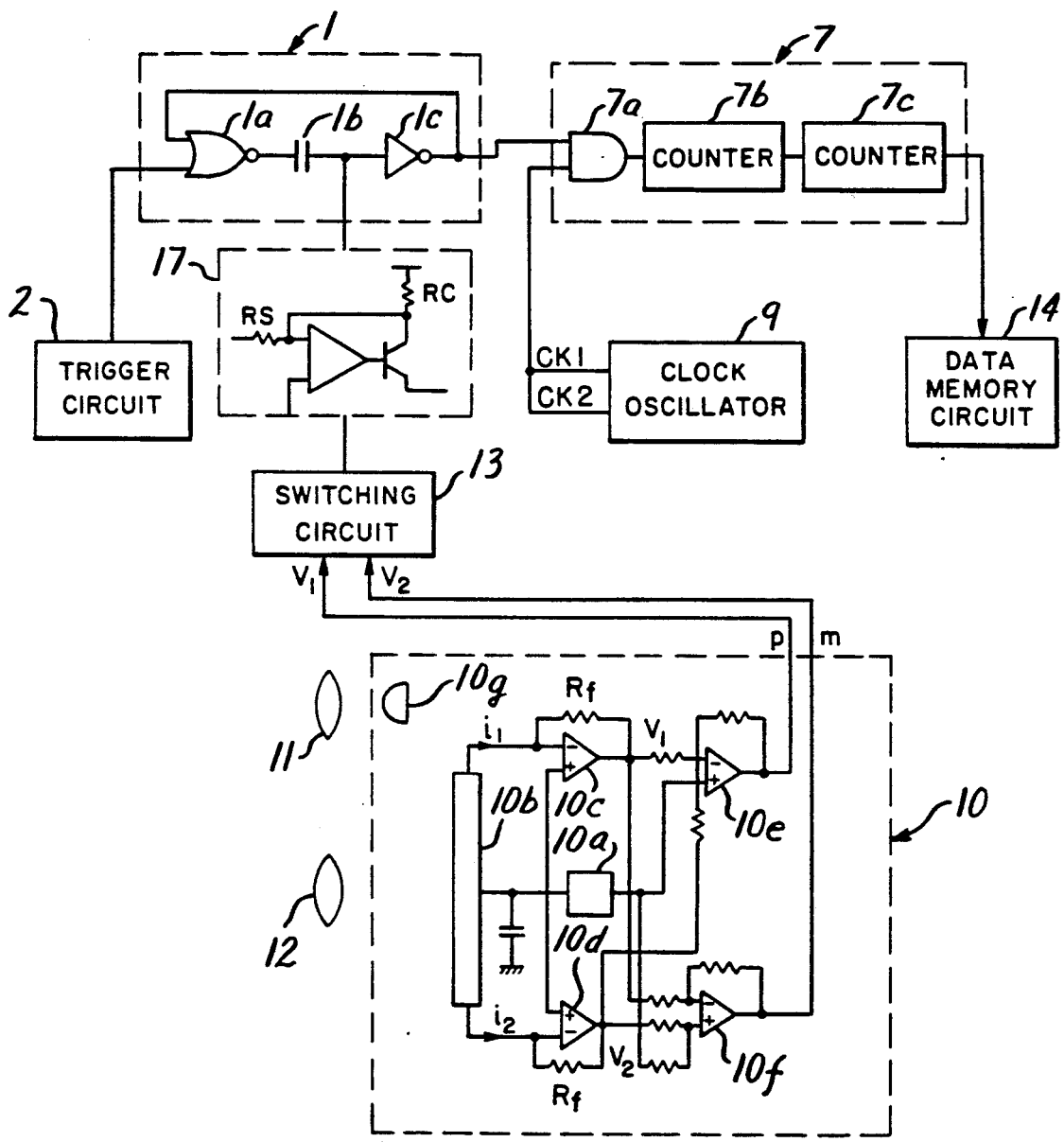
FIG. 3 is a block diagram of a device according to another embodiment of the present invention.

FIG. 3 is illustrative of a second embodiment of the present invention. Designated by the reference numeral 10 is a rangefinder circuit operable on the principle of trigonometric survey. The rangefinder circuit 10 has a bias voltage generator 10a for applying a reference voltage to the neutral point of a position sensitive device (PSD) 10b which produces currents from its opposite ends, which are converted by operational amplifiers 10c, 10d, respectively, shunted by feedback resistors Rf to voltage signals $v1 = Rf \times i1$, $v2 = Rf \times i2$, respectively. These voltage signals are applied respectively to inverting amplifiers 10e, 10f which produce an added signal $V1 = v1 + v2$ and a subtracted signal $V2 = v2 - v1$, respectively. Denoted at 10g is a light-emitting element, and 11, 12 condensing lenses.

Figure 4:
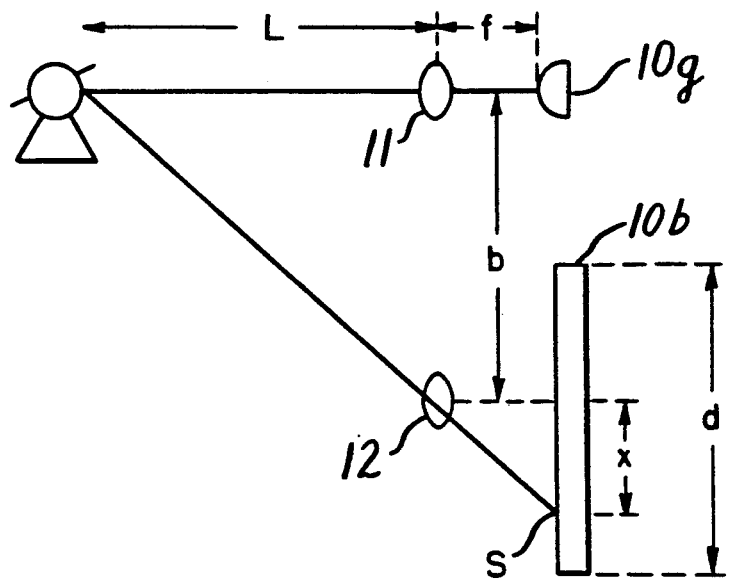
FIG. 4 is a diagram explaining the operation of a rangefinder circuit in the device shown in FIG. 3.
Figure 6:
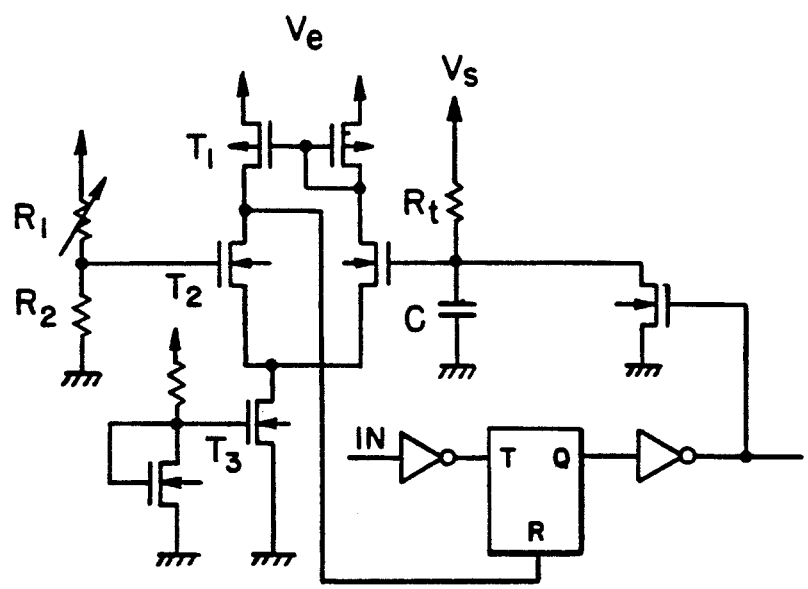
FIG. 6 is a circuit diagram of a conventional photometric circuit.

Assuming that the distance to an object is indicated by L, the length of the PSD 10b is indicated by d, the distance from the light-emitting element to the neutral point of the PSD 10b is indicated by b, and the distance between the position where a light spot is formed and the neutral point of the PSD 10b is indicated by x (FIG. 4), the output currents from the output terminals of the PSD 10b are indicated by $i1 = (d-2x)/2d \cdot F$, $i2 = (d+2x)/2d \cdot F$, respectively, where F indicates the intensity of the light spot which is determined by the distance L to the object and the reflectivity thereof.

Since the distance x between the neutral point and the light spot is expressed by $f \cdot b/L$ if the focal length of the lens 11 is indicated by f, the distance x is given by:

$$\frac{i2 - i1}{i1 + i2} = \frac{1}{L} \cdot \frac{2fb}{d}$$

Consequently, the distance L to the object is expressed by:

$$L = K \cdot (i1 + i2)/(i2 - i1)$$

Inasmuch as this proportionality equation does not contain the light intensity at the light spot as a factor, the distance can be detected irrespective of the reflectivity of the object and variations in the output from the light-emitting element.

The rangefinder circuit 10 has added and subtracted signal output terminals p, m connected through a switching circuit 13 and a voltage-to-current converter 17 to the one-shot multivibrator 1 so that the added and subtracted signals will be applied alternately to the multivibrator 1.

When the switching circuit B is connected to the output terminal p, the voltage-to-current converter 17 issues a current $I1 = k(i1 + i2)$, and when the switching circuit B is connected to the output terminal m, the voltage-to-current converter 17 issues a current $I2 = -k(i2 - i1)$, where k is a constant determined by RC, RS.

TABLE 2

| Zone | T2/T1 | Distance (m) |
|---|---|---|
| 0 | –64/40 | –0.96 |
| 1 | 64/40–64/35 | 0.96–1.09 |
| 2 | 64/35–64/30 | 1.09–1.28 |
| 3 | 64/30–64/25 | 1.28–1.54 |
| 4 | 64/25–64/20 | 1.54–1.92 |
| 5 | 64/20–64/15 | 1.92–2.56 |
| 6 | 64/15–64/10 | 2.56–3.84 |
| 7 | 64/10– | 3.84– |

A data memory circuit 14 stores as data distances corresponding to the pulse duration ratios and is addressable by the output signals from the pulse duration ratio computing circuit 7.

When the release button, for example, is depressed in order to measure the distance to the object, the added signal V1 from the rangefinder circuit 10 is applied through the switching circuit 13 to the voltage-to-current converter 17 which issues the signal $I1=k(i1+i2)$ to the one-shot multivibrator 1, which is also supplied with a trigger signal from the trigger circuit 2.

The multivibrator 1 then issues a pulse P1 having a duration determined by the values of the capacitor 1b and the current I1. The pulse P1 is applied to the pulse duration ratio computing circuit 7 to open the gate 7a, which allows the clock pulses CK1 to the presettable counter 7b which presets the number of clock pulses equal to the pulse duration. The pulse duration T1 of the pulse P1 is expressed by:

$$T1 = \frac{1}{I1} \cdot C\,Vth = \frac{1}{K(i1+i2)} \cdot C\,Vth$$

which is of a value proportional to (i1+i2).

Upon completion of the issuance of the pulse P1 based on the added signal V1, the switching circuit 13 is operated to apply the subtracted signal V2 from the rangefinder circuit 10 to the voltage-to-current converter 17, which then applies the signal $I2=k(i2-i1)$ to the multivibrator 1, which is also supplied with a trigger pulse.

The multivibrator 1 then produces a pulse P2 having a time duration T2, expressed below, proportional to the current I2.

$$T2 = \frac{1}{I2} \cdot C\,Vth = \frac{1}{K(i2-i1)} \cdot C\,Vth$$

The pulse P2 is applied to the pulse duration ratio computing circuit 7 to open the gate 7a which permits the clock pulses CK2 to be applied to the presettable counter 7b.

The presettable counter 7b issues a count-up signal each time its count reaches a preset value, and the count-up signals are counted by the counter 7c. The count or count number in the counter 7c is indicative of the ratio between the pulse signals P1, P2, i.e., $$\frac{T2}{T1} = \frac{\frac{1}{K(i2-i1)} \cdot C\,Vth}{\frac{1}{K(i1+i2)} \cdot C\,Vth} = \frac{(i1+i2)}{(i2-i1)}$$

and hence is of a value proportional to the distance L. The count is only related to (i1+i2) and (i2−i1) while the capacitance C of the capacitor 1b, the power supply voltage Ve, and the threshold voltage Vth are cancelled out. Accordingly, the count is highly accurate and free from the influences due to variations in the power supply voltage Ve, the threshold voltage Vth which varies with the power supply voltage, and the capacitance of the capacitor which varies with time and temperature.

The computed value is applied to the data memory circuit 14 to access a corresponding address for obtaining object distance information which is employed as a parameter for focal distance control and control.

Figure 5:
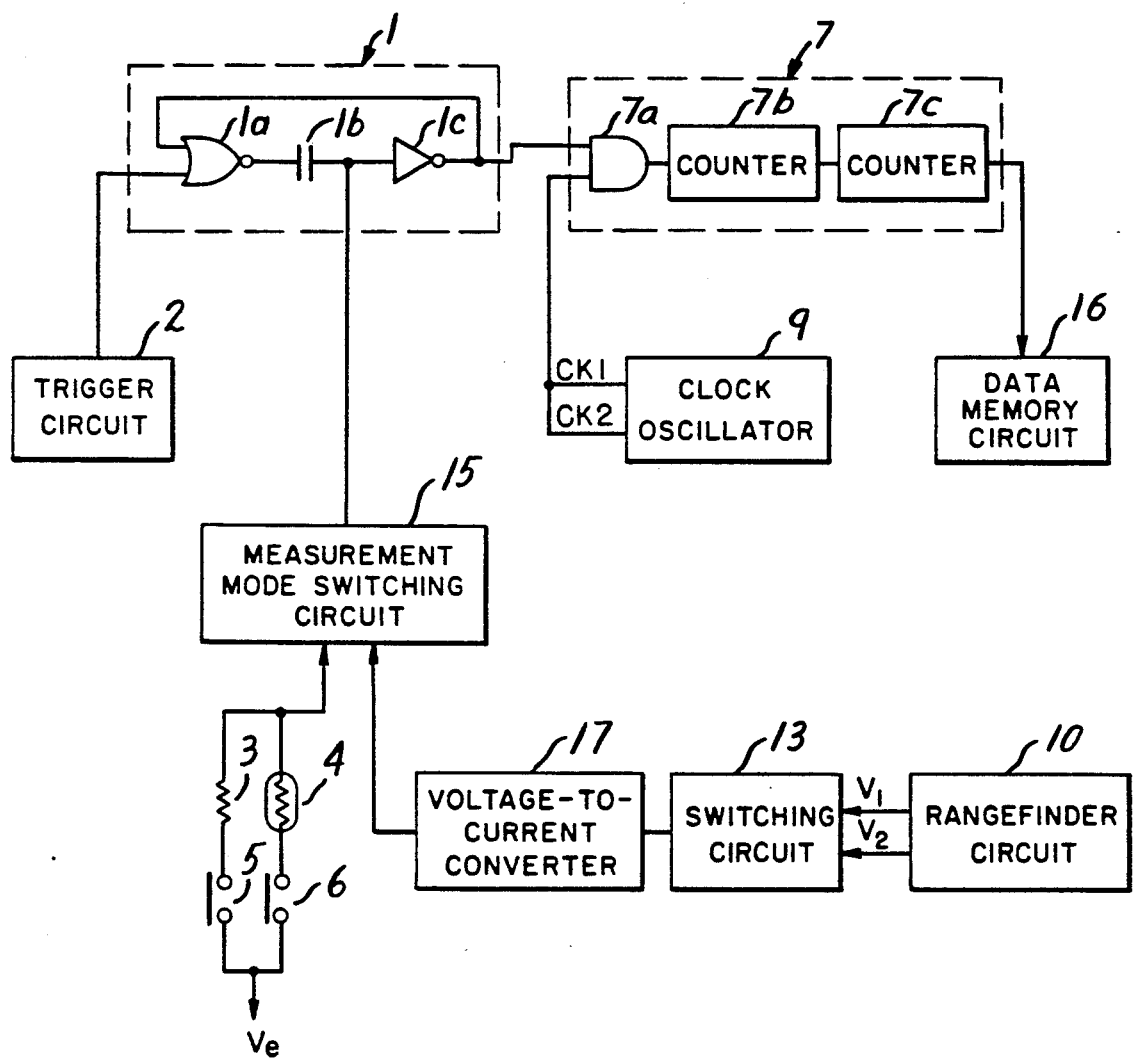
FIG. 5 is a block diagram of a device according to still another embodiment of the present invention.

FIG. 5 shows a third embodiment of the present invention. The reference resistor 3 and the light detector 4 of the photometric circuit, and the rangefinder circuit 10 are connected to the one-shot multivibrator 1 through a measurement mode switching circuit 15. In this embodiment, by operating the measurement mode switching circuit 15 in response to the release button, for example, the measured photometric and distance values can be converted by the common one-shot multivibrator 1 to a pulse duration ratio to access a data memory circuit 16 which stores object brightness and distance data for producing a digital signal. The arrangement of this embodiment is of a reduced cost.

While the pulse duration computing means is composed of a combination of counters in the above embodiments, a pulse duration computing circuit of another design may be employed. Either the reference value or the measured value may be applied first to the pulse duration ratio computing circuit. A silicon photodiode may be used as the light detector.

Advantages

With the present invention, as described above, since there are provided pulse output means alternately selectively connectable to a reference signal generating element and a measurement signal generating element which serve as elements for defining pulse durations, and means for computing the ratio of the pulse durations of two pulse signals from the pulse output means, a measured value can highly accurately be converted to a digital signal free from time- and temperature-dependent variations while cancelling out circuit constants such as the capacitance of the capacitor constituting a time-constant circuit and the voltages.

Inasmuch as pulse durations are compared, no comparator is required, and the power supply voltage can be lowered as much as possible.

The pulse duration ratios are used as addresses and the measured values corresponding to the pulse duration ratios are stored as data in the memory means. Therefore, device variations can be compensated for simply by varying the data to be stored according to characteristics and tolerances of the detector and circuit components. Consequently, parameters for camera control can be obtained with high accuracy without the need for highly accurate circuit components.

What is claimed is:

1. An analog-to-digital converter for a camera, comprising pulse output means alternately selectively connectable to a reference analog signal generating element and a measurement analog signal generating element for producing signals having pulse durations corresponding to a parameter of each element, means for computing a number indicative of the ratio of the pulse durations of two pulse signals from said pulse output means and for producing a digital signal indicative of the ratio, and memory means for storing control information representative of said ratio and receptive of the digital signal for outputting information indicative of the computed ratio.

2. A photometric device for a camera according to claim 1, further comprising memory means for storing groups of control information according to characteristics of the measurement signal generating element, and condition setting means for externally selecting one of said plurality of groups of control information.

3. A signal converter device for a camera, comprising: means for producing a first analog signal; means for producing a second analog signal; means alternately receptive of the first and second analog signals for producing output signals for the first and second signals having a pulse duration which is a function of a parameter of the first and second signals; means receptive of the output signals for the first and second signals for computing a number indicative of the ratio of the pulse durations thereof and for producing a digital signal indicative of the ratio; and means for storing control information and receptive of the digital signal for outputting control information indicative of the computed ratio.

4. The device according to claim 3, wherein the means for producing the output signals comprises a two input NOR-gate with one input receptive of a trigger pulse; a capacitor connected at one terminal with the output of the NOR-gate and an inverter having its input connected to the other terminal of the capacitor and having the output thereof connected to the other input of the NOR-gate and wherein the first and second signals are received at the input of the inverter.

5. The device according to claim 3, wherein the means for computing a number indicative of the ratio comprises a first counter for counting a first count of clock pulses corresponding to the duration of the output signal produced for the first analog signal and a second counter for counting the number of first counts corresponding to the duration of the output signal produced for the second analog signal.

* * * * *